(12) United States Patent
Aritome (10) Patent No.: US 7,663,930 B2
(45) Date of Patent: *Feb. 16, 2010

(54) PROGRAMMING A NON-VOLATILE MEMORY DEVICE

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/170,607

(22) Filed: Jul. 10, 2008

(65) Prior Publication Data

US 2008/0266972 A1 Oct. 30, 2008

Related U.S. Application Data

(63) Continuation of application No. 11/436,323, filed on May 18, 2006, now Pat. No. 7,411,832.

(51) Int. Cl.
*G11C 11/34* (2006.01)
(52) U.S. Cl. .................. 365/185.22; 365/185.33; 365/185.17
(58) Field of Classification Search ........... 365/185.22, 365/185.33, 185.17
See application file for complete search history.

(56) References Cited

U.S. PATENT DOCUMENTS

| | | | |
|---|---|---|---|
| 5,272,669 A | 12/1993 | Samachisa et al. | |
| 5,323,351 A | 6/1994 | Challa | |
| 5,768,191 A | 6/1998 | Choi | |
| 5,943,261 A | 8/1999 | Lee | |
| 6,487,117 B1 * | 11/2002 | Choi et al. | 365/185.17 |
| 6,567,302 B2 | 5/2003 | Lakhani | |
| 6,614,688 B2 | 9/2003 | Jeong et al. | |
| 6,768,682 B2 | 7/2004 | Yano et al. | |
| 6,954,380 B2 | 10/2005 | Ono et al. | |
| 7,020,017 B2 | 3/2006 | Chen et al. | |
| 7,038,949 B2 | 5/2006 | Chae et al. | |
| 7,301,817 B2 | 11/2007 | Li et al. | |
| 7,411,832 B2 * | 8/2008 | Aritome | 365/185.22 |

* cited by examiner

*Primary Examiner*—Son Dinh
*Assistant Examiner*—Nam Nguyen
(74) *Attorney, Agent, or Firm*—Leffert Jay & Polglaze, P.A.

(57) ABSTRACT

A non-volatile memory device that changes the programming step voltage between the source side of the array and the drain side of the array. After the initial programming pulse, a verify operation determines if the cell has been programmed. If the cell is still erased, the initial programming voltage is increased by the step voltage. The step voltage for the lowest word line near the source line is lower than the step voltage for the word line closest to the drain line.

20 Claims, 6 Drawing Sheets

PROGRAMMING A NON-VOLATILE MEMORY DEVICE

RELATED APPLICATION

This application is a continuation of U.S. application Ser. No. 11/436,323, filed May 18, 2006, now U.S. Pat. No. 7,411, 832 titled "PROGRAMMING A NON-VOLATILE MEMORY DEVICE" (allowed), which is commonly assigned and incorporated herein by reference.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures. These architectures are named for the resemblance that the basic memory cell configuration of each architecture has to a basic NAND or NOR gate circuits, respectively.

Figure 1:
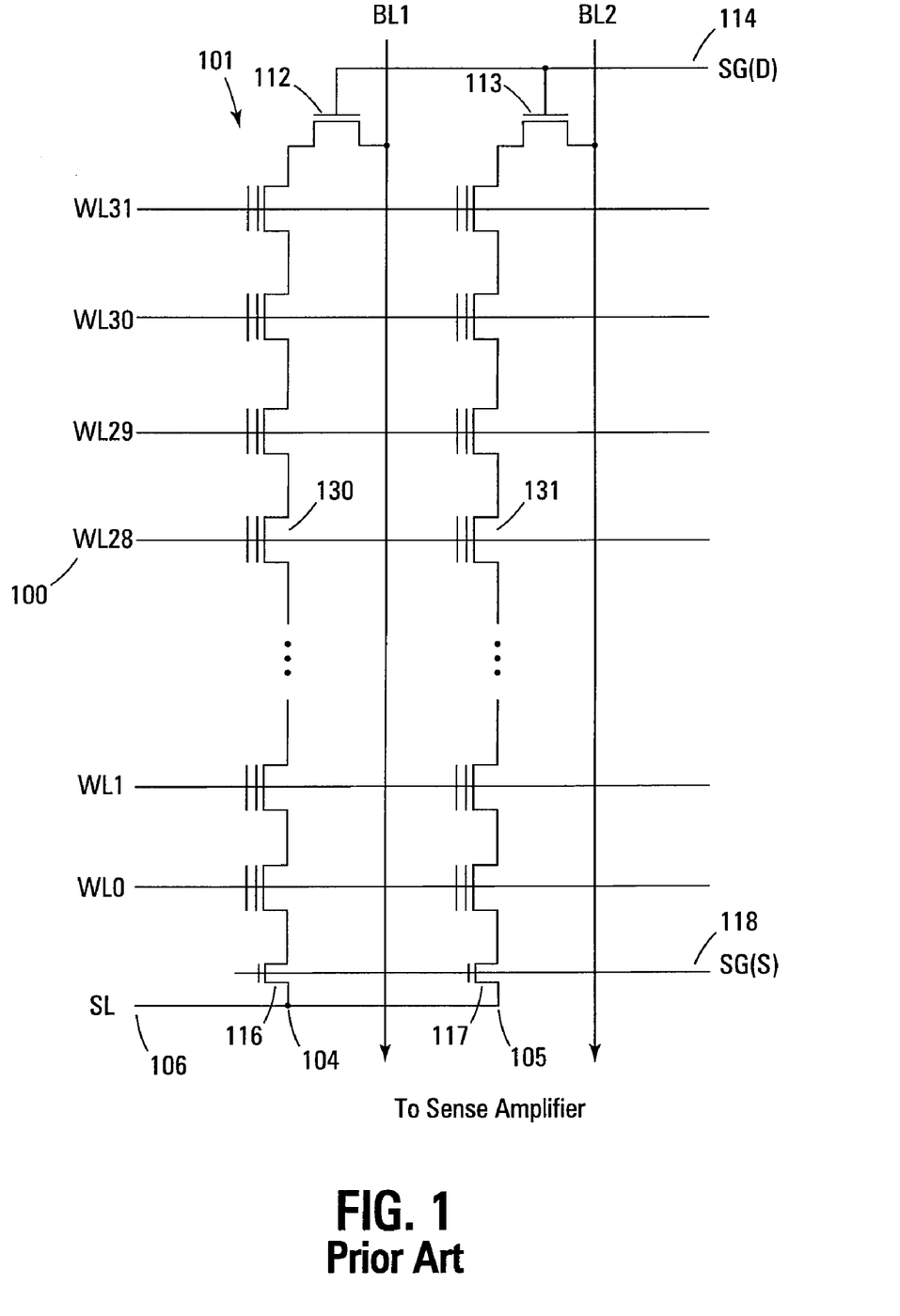
FIG. 1 shows a portion of a typical prior art NAND architecture flash memory array.

FIG. 1 illustrates a simplified diagram of a typical prior art NAND flash memory array. The memory array of FIG. 1, for purposes of clarity, does not show all of the elements typically required in a memory array. For example, only two bit lines are shown (BL1 and BL2) when the number of bit lines required actually depends upon the memory density. The bit lines are subsequently referred to as (BL1-BLN).

The array is comprised of an array of floating gate cells 101 arranged in series strings 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. The bit lines (BL1-BLN) are eventually coupled to sense amplifiers (not shown) that detect the state of each cell.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1-BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

A selected word line 100 for the flash memory cells 130-131 being programmed is typically biased by programming pulses that start at a voltage of around 16V and may incrementally increase to more than 20V. The unselected word lines for the remaining cells are typically biased at $V_{pass}$. This is typically in an approximate range of 9-10V. The bit lines of the cells to be programmed are typically biased at 0V while the inhibited bit lines are typically biased at $V_{CC}$.

As NAND flash memory is scaled, parasitic capacitance coupling between adjacent memory cell floating gates becomes a problem. Because of the capacitive coupling, the cells that are adjacent to a cell storing a charge are prone to having their threshold voltages ($V_t$) raised. If the adjacent cells have their threshold voltages raised too high, an unprogrammed cell might appear as being programmed. Due to floating gate-to-floating gate interference, a cell $V_t$ of a source side cell is higher than $V_t$ during a verify operation. For example, $V_t$ may be 0.8V at verify but after the entire page of cells has been programmed, $V_t$ may be 1.2V. These effects generate a wider $V_t$ distribution when the distribution is needed to be tighter.

Additional NAND memory array problems are series string resistance issues and source resistance issues. String resistance increases from a programmed cell in the same string. This reduces the cell current and increases $V_t$ for unprogrammed cells.

Similarly, increased source resistance creates a higher voltage drop per cell at the source wiring. Cell current is reduced and $V_t$ is increased for unprogrammed cells.

Figure 2:
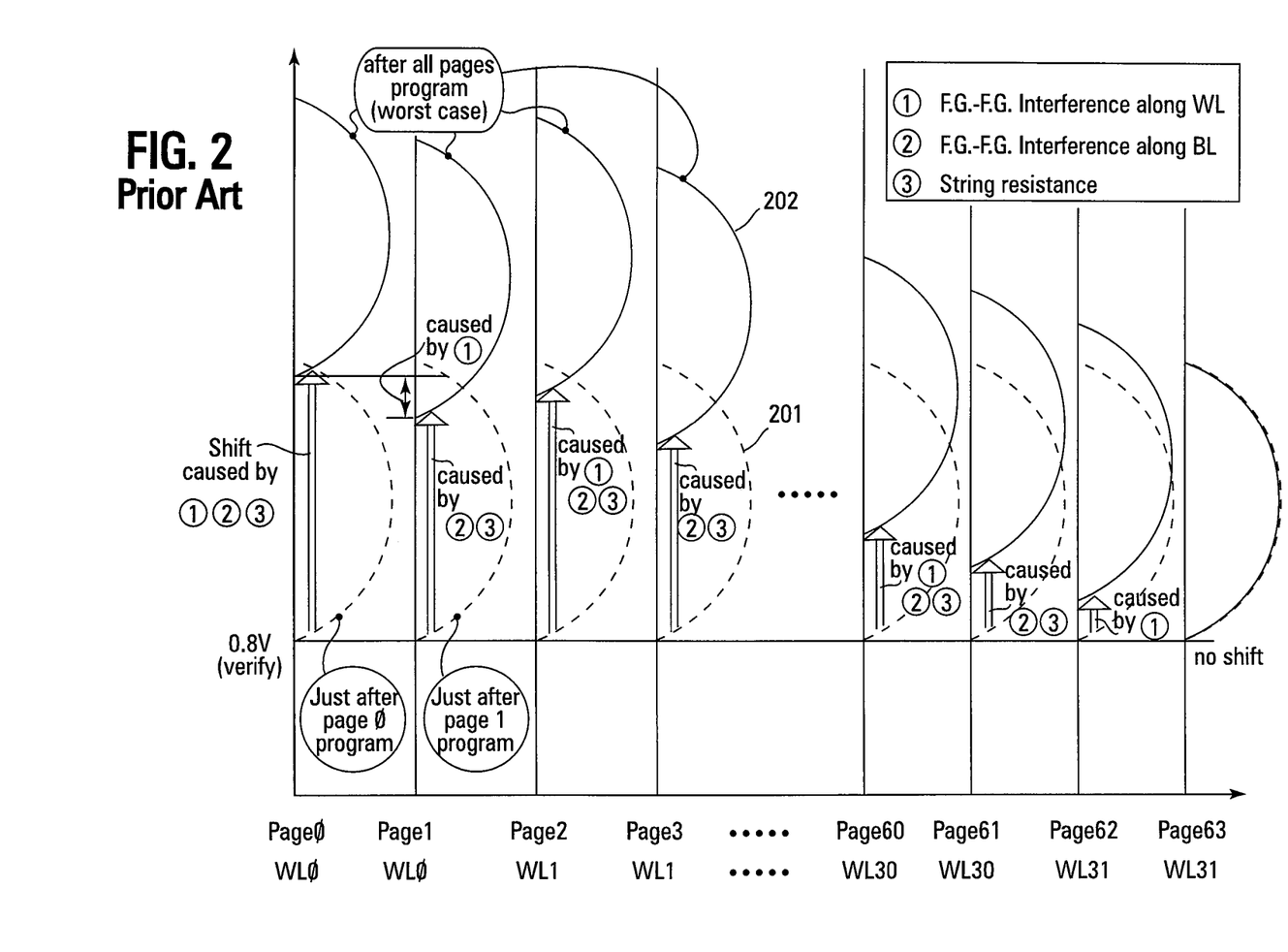
FIG. 2 shows a typical prior art $V_t$ distribution for a memory programming method with resulting interference.

These problems are illustrated in FIG. 2 that shows a memory programming method with the resulting floating gate-to-floating gate interference and the string resistance. This plot shows the $V_t$ shifts for each word line (i.e., WL0-WL31) and a reason for a particular shift. For example, page 3 shows that the $V_t$ shift was caused by floating gate-to-floating gate interference along the bit line as well as the string resistance. The dotted line 201 shows the original $V_t$ and the solid line 202 shows the worst case shifted $V_t$ after all pages have been programmed.

The above-described problems for single level cell (SLC) NAND arrays are even worse in a multiple level cell (MLC) array. MLC memory stores multiple bits on each cell by using different threshold levels for each state that is stored. The difference between adjacent threshold voltage distributions is typically very small as compared to an SLC memory device. Therefore, the effects of the floating gate-to-floating gate coupling in an MLC device are greatly increased.

For the reasons stated above, and for other reasons stated below which will become apparent to those skilled in the art upon reading and understanding the present specification, there is a need in the art for a way to minimize the effects of coupling, string resistance, and source resistance in a memory device.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

The embodiments of the present invention for programming a non-volatile memory cell are comprised of biasing the word line coupled to the control gate of the cell with a series of programming pulses. The series of pulses start at a predetermined $V_{pgm}$ and each subsequent pulse is incremented until a verify operation determines that the selected cell is programmed. $V_{pgm}$ is incremented by a step-up or increment voltage that varies with the word line being biased. The different embodiments of the present invention provide various methods for increasing the step-up voltage as the programming progresses from the word line closest to the source line (i.e., bottom of the array) to the word line closest to the drain line (i.e., top of the array). However, the present invention is not limited to any one way to increase the step-up voltage.

The different embodiments of the programming method of the present invention provide faster programming due to the increased step-up from previous $V_{pgm}$ voltages and also tighter $V_t$ distributions. While the present invention can be implemented in single level cell memory arrays, the increase in programming performance provided by the present invention is especially effective in multilevel cell arrays.

Figure 3:
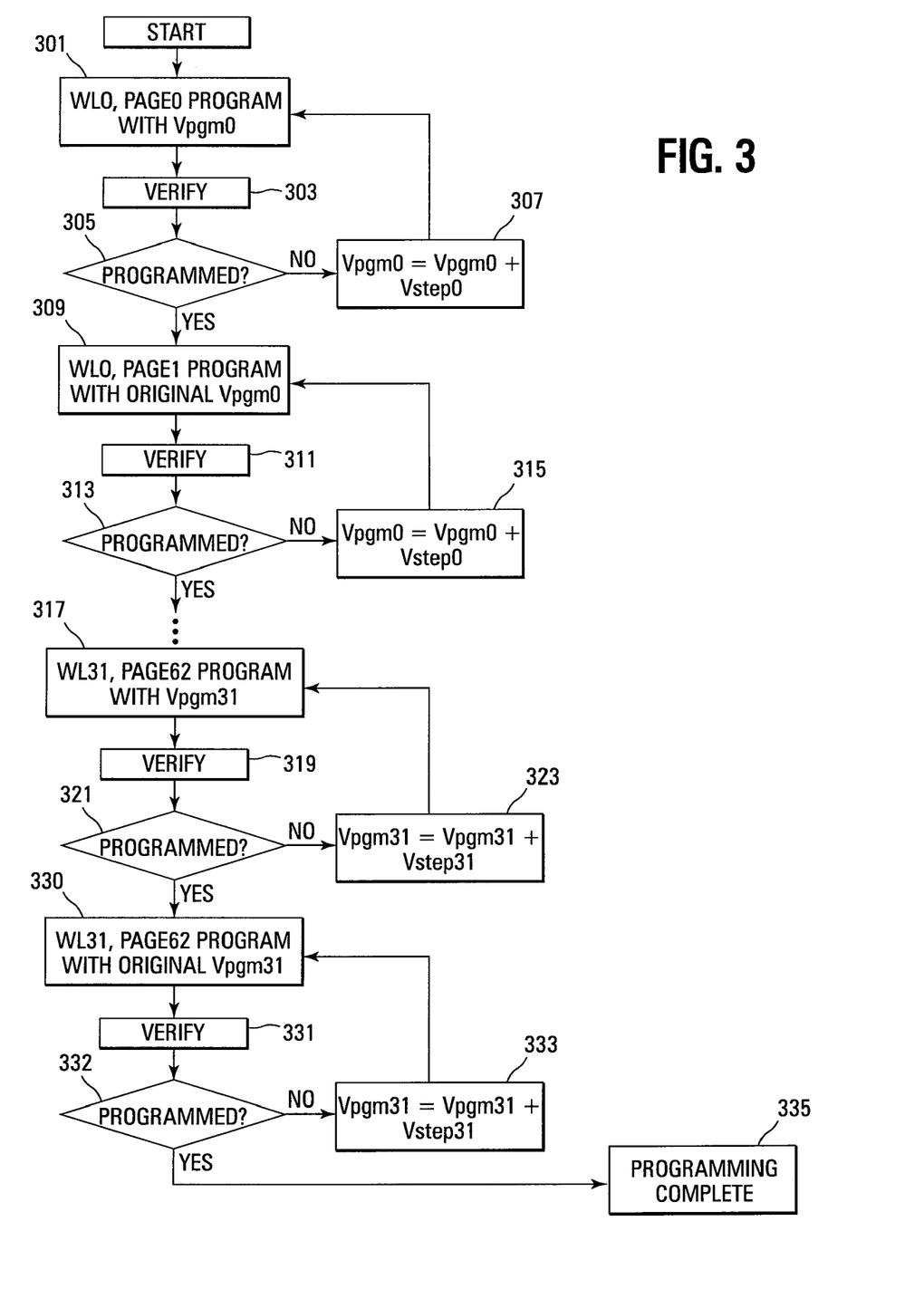
FIG. 3 shows a flowchart of one embodiment of the programming method of the present invention.

FIG. 3 illustrates a flowchart of one embodiment of a method of the present invention for programming a non-volatile memory array. The subsequent discussion uses a NAND architecture flash memory array as an example. However, the present invention is not limited to any one architecture or type of memory device.

The method programs the memory device starting at WL0. The embodiment of FIG. 3 increases the step-up or increment voltage as each of the word lines is programmed. For example, the lowest word line WL0 may have a $V_{step0}$ of 0.4V, WL1 has $V_{step1}$=0.415V, WL2 has $V_{step2}$=0.43V, ... WL31 has $V_{step31}$=0.865V. In other words, $V_{step0} \leq V_{step1} \leq V_{step2} \leq \ldots V_{step31}$. Thus, if cells on WL2 are still erased after being biased by an initial programming pulse of 16V, $V_{pgm}$ is incremented by 0.43V so that $V_{pgm}$=16.43V for the next pulse and $V_{pgm}$=16.86V for the next pulse. This continues up to a maximum programming voltage (e.g., 20V). These voltages are for purposes of illustration only as the present invention is not limited to any one $V_{pgm}$ or any one increase of the increment voltage.

The programming method of FIG. 3 starts by biasing the initial word line (e.g., WL0) with an initial programming pulse of $V_{pgm0}$ (e.g., 16V) 301 to program page0 of WL0. A program verify operation is then performed 303 to determine if page0 of the selected cells have been programmed. The program verify operation is comprised of biasing the selected word line with a verify voltage. If page 0 of the cell or cells are not programmed, $V_{pgm0}$ is incremented by the $V_{step0}$ assigned to WL0 (e.g., 0.4V) 307. The program/verify operations 301, 303 are then repeated until either the page is programmed 305 or the maximum $V_{pgm}$ has been reached.

If WL0, page0 has been programmed, WL0, page 1 is then programmed in the same manner. Starting at the initial $V_{pgm0}$ of the page0 program operation, WL0, page1 is programmed 309. The verify operation is then performed 311 to determine if page1 of WL0 has been programmed 313. If page1 of the cell or cells are not programmed, $V_{pgm0}$ is incremented by $V_{step0}$ assigned to WL0 315. The program/verify operations 309, 311 are then repeated until either page1 is programmed 313 or the maximum $V_{pgm}$ has been reached.

The above-described programming operation is repeated for each page of each of the 32 word lines. Word line WL31, page62 is then biased 317 and a program verification 319 performed. If a cell or cells are still not programmed 321, $V_{pgm}$ is incremented by $V_{step31}$ (e.g., 0.865V). The bias/verify/increment operations 317, 319, 323 are repeated until the maximum programming voltage is reached or the cell or cells are programmed.

WL31, page63 is programmed 330 starting at the original $V_{pgm31}$ from above. The verify operation 331 is done. If the page is programmed 332, the programming operation has been completed 335. If the page has not been programmed, $V_{pgm31}$ is incremented by $V_{step31}$ until the page has been programmed or the maximum $V_{pgm}$ has been reached. At this point the programming has been completed 335.

Figure 4:
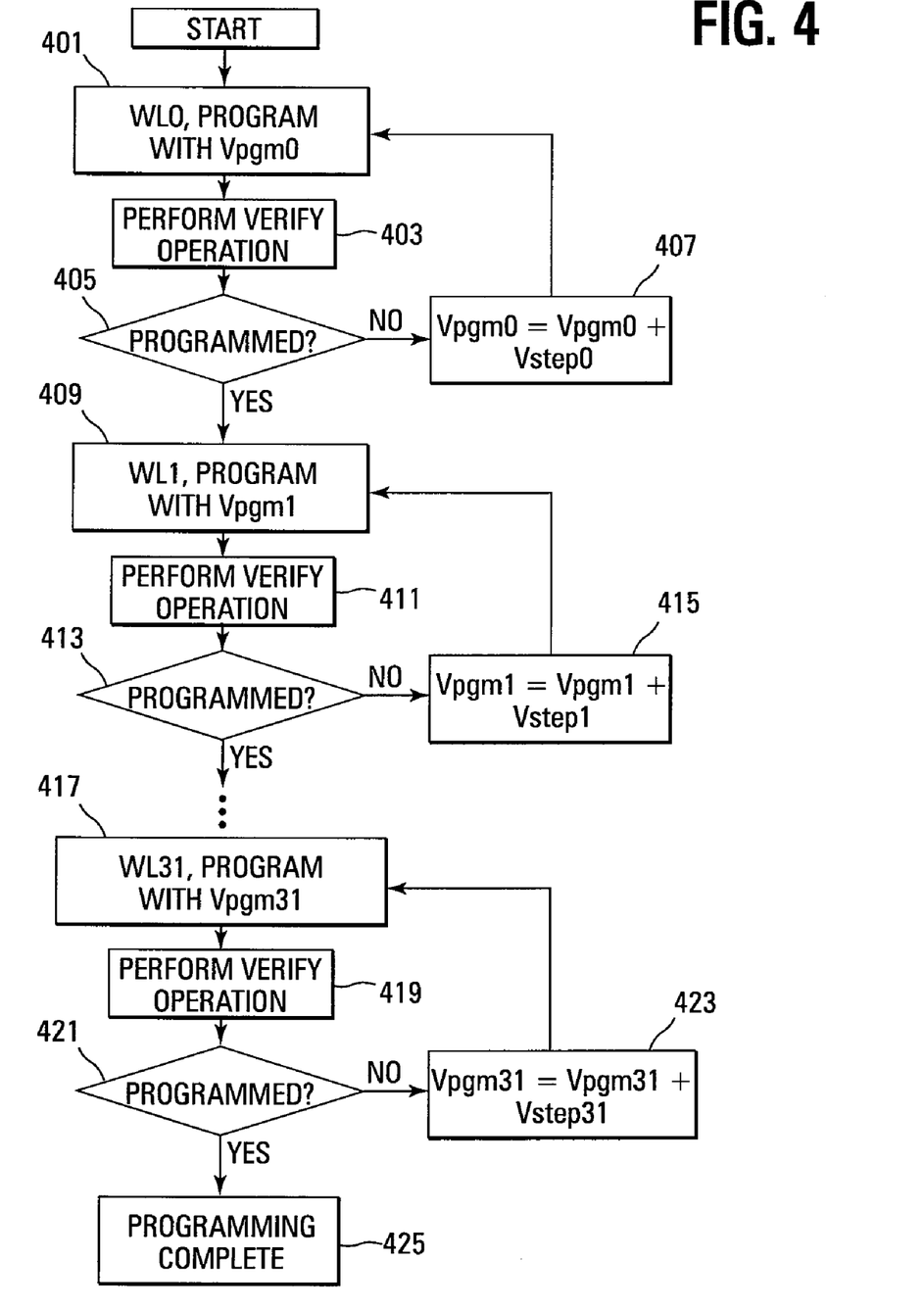
FIG. 4 shows a flowchart of another embodiment of the programming method of the present invention.

FIG. 4 illustrates a flowchart of another embodiment of the programming method of the present invention. As in other embodiments of the present invention, the increment voltage is increased between the first word line and the last word line to be programmed. This embodiment keeps the increment voltage $V_{step}$ the same for a first group of word lines then increases $V_{step}$ for a remaining group of word lines.

FIG. 4 illustrates one example of such an embodiment in that the first 31 word lines WL0-WL30 use a $V_{step}$ of 0.4V. The remaining word line WL31 (page 62, 63) nearest the drain line has a $V_{step}$ of 0.8V. Such an embodiment is effective in cases of larger floating gate-to-floating gate (F.G.-to-F.G.) interference along the bit lines and to string resistance along the word lines.

The voltages of the embodiment of FIG. 4 are for purposes of illustration. Alternate embodiments can use other $V_{step}$ voltages as well as different quantities of word lines in each group. For example, in an alternate embodiment, WL0-WL29 may use $V_{step1}$=0.4V and WL30-31 use a $V_{step2}$=0.8V. WL0-7 may use $V_{step}$=0.4V, WL8-15 may use $V_{step}$=5.5V, WL16-23 may use $V_{step}$=0.7V, and WL24-31 may use $V_{step}$=0.8V.

The method of FIG. 4 starts with biasing the initial word line WL0 with $V_{pgm}$ 401. The program verify operation is performed 403. If the result is that one or more cells of the word line are still erased 405, $V_{pgm}$ is incremented by $V_{step1}$ 407 and the program/verify operations 401, 403 are repeated. The $V_{pgm}$ voltage is incremented by $V_{step1}$ 407 until either the maximum program voltage is reached or the cell(s) are programmed 405.

If the cell or cells are programmed on WL0, WL1 is then biased with $V_{pgm}$ 409 and the verify operation performed 411. If the cell(s) are not programmed 413, $V_{step1}$ is again used to increment $V_{pgm}$ 415 and the program/verify operations 409, 411 are repeated with $V_{step1}$ increments until they are programmed or the maximum voltage reached.

The final word line WL31 is biased with $V_{pgm}$ 417 and verified 419. If the cell is not programmed, the larger increment voltage of $V_{step2}$ is used to increase $V_{pgm}$ 423. The program/verify operations are repeated 417, 419 as before. When the maximum voltage is reached or the cell(s) programmed 421, the page has been programmed 425.

In still another embodiment, the $V_{step}$ voltage is different not only from the source side word line to the drain side word line but also between the odd and even pages of the memory block. This embodiment is useful in the case of F.G.-to-F.G. interference. Such an embodiment follows the flowcharts of both FIGS. 3 and 4.

For example, for the even pages of WL0 to WL30, $V_{step}$ is decreased by the voltage shifts caused by the F.G.-to-F.G. interference along the word lines, the F.G.-to-F.G. interference along the bit lines, and the string resistance. These voltage shifts are illustrated in FIG. 2.

For the odd pages of WL0 to WL30, $V_{step}$ is decreased by the voltage shifts caused by the F.G.-to-F.G. interference along the bit lines and the string interference. For the even page of WL31, the $V_{step}$ voltage is decreased by the voltage shift caused by the F.G.-to-F.G. interference along the word lines. For the odd page of WL31, $V_{step}$ is used without any reduction in voltage.

In one embodiment, page 62 uses a $V_{step}$ of 0.6V. Page 63 uses a $V_{step}$ of 0.8V. Other pages use a $V_{step}$ of 0.4V.

The average voltage shifts caused by the floating gate interference along the word lines and along the bit lines as well as the varying string resistance caused by programming upward from the lower word line to the upper word line can be determined by experimentation. Once the average values are determined, they can be stored in each memory integrated circuit and used by the memory controller during the programming operations. Such a controller used for controlling programming and verification of memory cells is illustrated subsequently with reference to FIG. 5.

Figure 5:
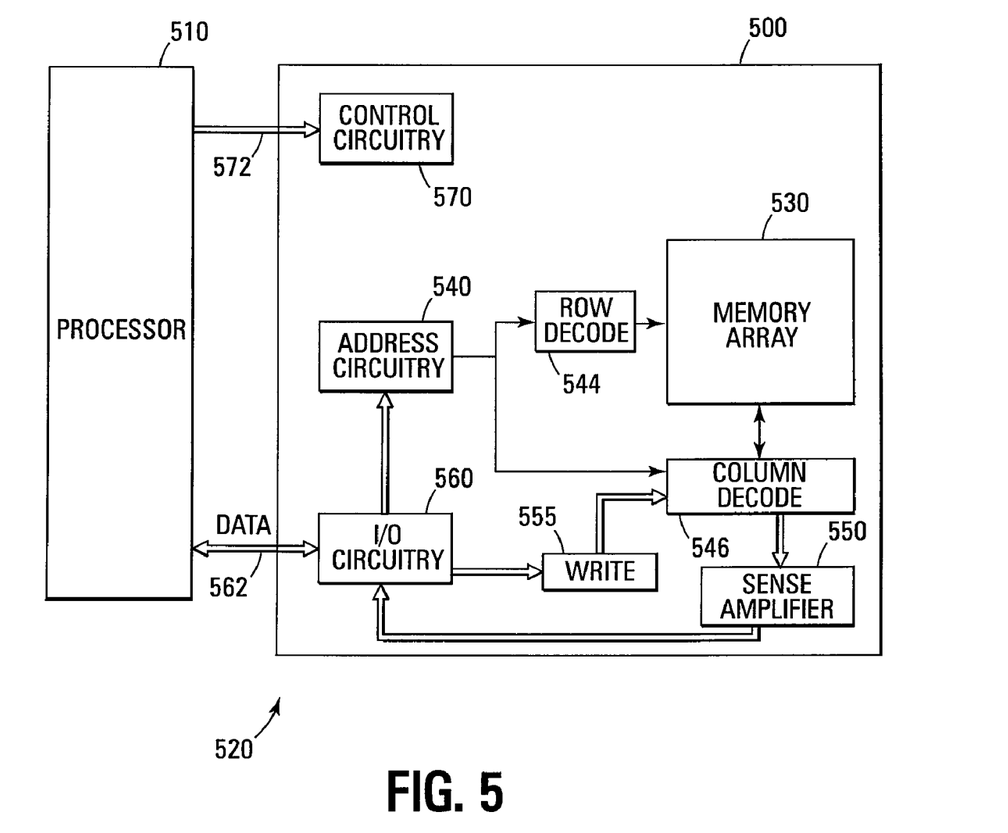
FIG. 5 shows a block diagram for one embodiment of a memory system of the present invention.

FIG. 5 illustrates a functional block diagram of a memory device 500 that can incorporate the non-volatile memory cells of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of flash memory cells 530 or some other type of non-volatile memory cells. The memory array 530 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture, a NOR architecture, an AND architecture, or some other array architecture.

An address buffer circuit 540 is provided to latch address signals provided over I/O connections 562 through the I/O circuitry 560. Address signals are received and decoded by a row decoder 544 and a column decoder 546 to access the memory array 530. It will be appreciated by those skilled in the art that, with the benefit of the present description, the number of address input connections depends on the density and architecture of the memory array 530. That is, the number of addresses increases with both increased memory cell counts and increased bank and block counts.

The memory integrated circuit 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bidirectional data communication over the I/O connections 562 with the processor 510. Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller. The control circuitry 570 of the present invention, in one embodiment, is responsible for executing the embodiments of the programming method of the present invention.

The flash memory device illustrated in FIG. 5 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 6:
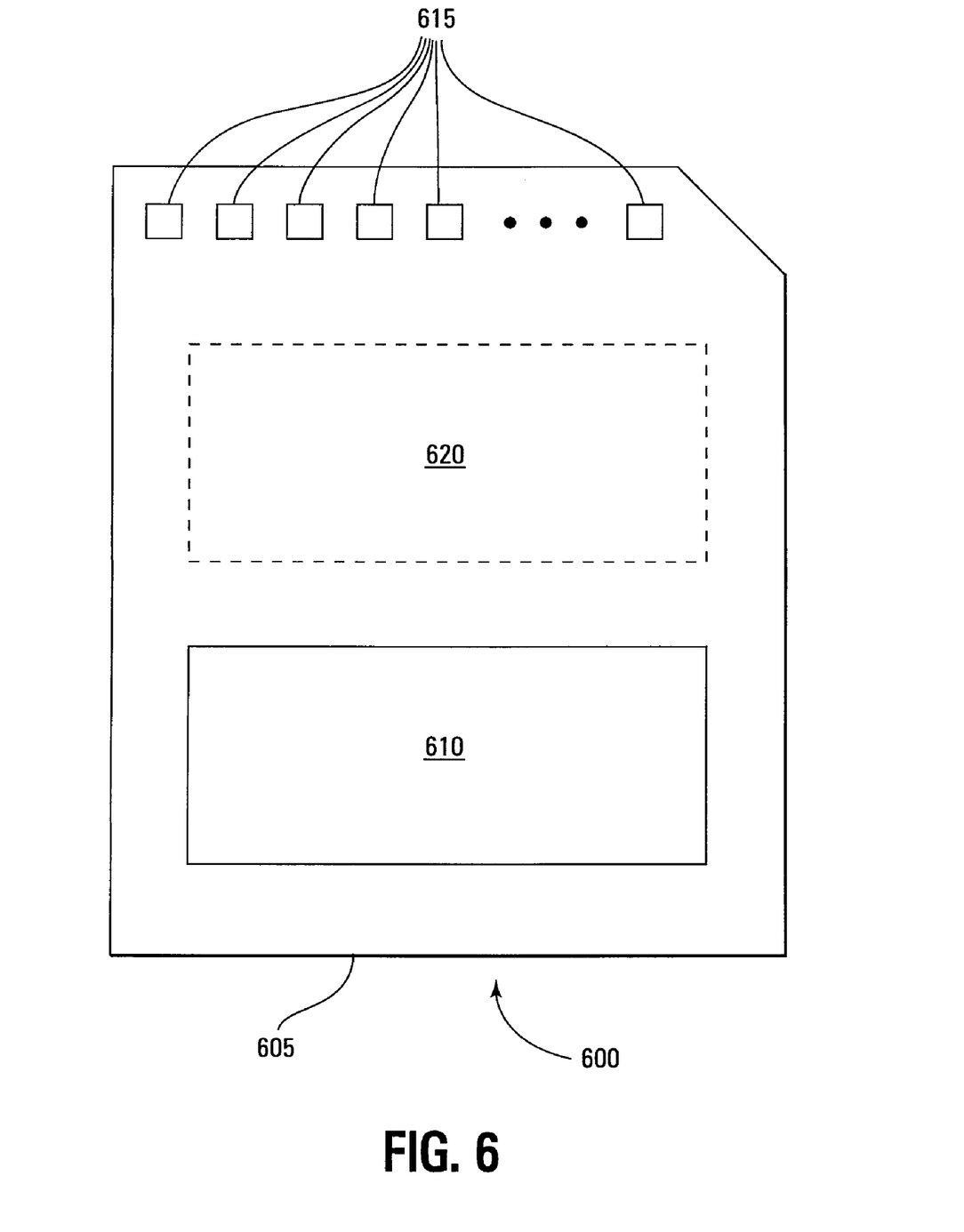
FIG. 6 shows a block diagram for one embodiment of a memory module of the present invention.

FIG. 6 is an illustration of a memory module 600 that incorporates the memory cell embodiments as discussed previously. Although memory module 600 is illustrated as a memory card, the concepts discussed with reference to memory module 600 are applicable to other types of removable or portable memory, e.g., USB flash drives. In addition, although one example form factor is depicted in FIG. 6, these concepts are applicable to other form factors as well.

Memory module 600 includes a housing 605 to enclose one or more memory devices 610 of the present invention. The housing 605 includes one or more contacts 615 for communication with a host device. Examples of host devices include digital cameras, digital recording and playback devices, PDAs, personal computers, memory card readers, interface hubs and the like. For some embodiment, the contacts 615 are in the form of a standardized interface. For example, with a USB flash drive, the contacts 615 might be in the form of a USB Type-A male connector. For some embodiments, the contacts 615 are in the form of a semi-proprietary interface, such as might be found on COMPACTFLASH memory cards licensed by SANDISK Corporation, MEMORY STICK memory cards licensed by SONY Corporation, SD SECURE DIGITAL memory cards licensed by TOSHIBA Corporation and the like. In general, however, contacts 615 provide an interface for passing control, address and/or data signals between the memory module 600 and a host having compatible receptors for the contacts 615.

The memory module 600 may optionally include additional circuitry 620. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610. The additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

In summary, the embodiments of the present invention provide a way to reduce or eliminate increased $V_t$ effects from floating gate-to-floating gate, string resistance, and source line resistance. This is accomplished by increasing the programming step voltage between the source side of the array and the drain side of the array. This provides faster programming due to the increased step-up from previous $V_{pgm}$ voltages and also tighter $V_t$ distributions.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a memory device having a plurality of memory cells, the method comprising:
   biasing a selected memory cell with an initial programming voltage;
   verifying whether the selected memory cell is programmed; and
   incrementing the initial programming voltage by a step voltage if the verifying determines that the selected memory cell is not programmed, wherein the step voltage is determined in response to a location of the selected memory cell with respect to a source line and a drain line of the memory device.

2. The method of claim 1 wherein the step voltage is increased as the selected memory cell moves from being closer to the source line to being closer the drain line of the memory device.

3. The method of claim 1 wherein verifying comprises biasing the first word line with a verifying voltage to read the first memory cell.

4. The method of claim 1 wherein the selected memory cell is initially closest to the source line of the memory device during an initial programming.

5. The method of claim 1 wherein the selected memory call is part of a selected word line and the step voltage is incrementally increased for each selected word line moves further from a source side word line and closer to a drain side word line.

6. The method of claim 1 wherein the step voltage is increased only for the drain side word line.

7. A method for programming a non-volatile memory array having a plurality of memory cells, the method comprising:
   biasing a selected row of memory cells with a programming voltage;
   performing a program verify operation on the selected row of memory cells to determine if memory cells of the selected row are programmed; and
   incrementing the programming voltage by a step voltage if the verify operation determines that the selected row of memory cells is not programmed wherein the step voltage increases a different amount for each of a plurality of subsets of rows between a source line of the memory array and a drain line of the memory array.

8. The method of claim 7 and further including biasing the selected row with a voltage equal to the programming voltage plus the step voltage that is associated with a first subset of rows of the plurality of subsets of rows.

9. The method of claim 7 and further including:
   selecting different rows of memory cells for programming;
   initially biasing each selected row with the programming voltage;
   performing a program verify operation on each of the selected rows; and
   if the program verify operation determines that a particular row is not programmed, incrementing the programming voltage by the step voltage associated with the particular row in response to the subset of rows with which the particular row is associated.

10. A method for programming a non-volatile memory array having a plurality of memory cells organized in odd and even pages, the method comprising:
    biasing a selected page of memory cells with a programming voltage;
    performing a program verify operation on the selected page of memory cells; and
    incrementing the programming voltage by a step voltage if the program verify operation determines that the selected page of memory cells is not programmed, wherein the step voltage increases for a predetermined subset of pages between source line and a drain line of the memory array and further wherein the step voltage increase is greater for odd pages of the predetermined subset than for even pages of the predetermined subset.

11. The method of claim 10 wherein the step voltage is decreased by floating gate-to-floating gate interference along a bit line of the array.

12. The method of claim 10 wherein the step voltage is decreased by floating gate-to-floating gate interference along a word line of the array.

13. The method of claim 10 wherein the programming voltage is incremented by the step voltage until the selected page is programmed or a maximum programming voltage is reached.

14. A non-volatile memory device comprising:
    a memory array comprising a plurality of cells organized between a source line and a drain line; and
    control circuitry coupled to the memory array and configured to control operation of the memory device, the control circuitry configured to program the memory array by incrementing an initial programming voltage by a step voltage in response to a program verify operation, wherein the step voltage is different for portions of the memory array that are closer to the source line than the drain line.

15. The device of claim 14 wherein the memory array is further broken down into odd pages and even pages and the control circuitry is further configured to increase the step voltage a greater amount for odd pages than for even pages.

16. The device of claim 14 wherein the memory array is a flash memory array having a NAND architecture.

17. A memory system comprising:
a processor that generates memory signals; and
a non-volatile memory device coupled to the processor and operating in response to the memory signals, the device comprising:
a memory array comprising a plurality of cells organized between a source side word line closest to a source line and a drain side word line closest to a drain line; and
control circuitry coupled to the memory array and configured to control operation of the memory device, the control circuitry configured to program selected memory cells of the memory array by increasing an initial programming voltage by a step voltage if a program verify operation indicates that the selected memory cells are not programmed, wherein the step voltage is different for memory cells on the source side word line than for memory cells on the drain side word line.

18. The system of claim 17 wherein the memory signals include program instructions.

19. The system of claim 17 wherein the memory signals include memory control, address, and data signals.

20. The system of claim 17 wherein the drain side of the memory array is coupled to a bit line.

* * * * *

UNITED STATES PATENT AND TRADEMARK OFFICE
CERTIFICATE OF CORRECTION

PATENT NO. : 7,663,930 B2
APPLICATION NO. : 12/170607
DATED : February 16, 2010
INVENTOR(S) : Seiichi Aritome It is certified that error appears in the above-identified patent and that said Letters Patent is hereby corrected as shown below:

In column 7, line 55, in Claim 2, after "closer" insert -- to --.

In column 7, line 63, in Claim 5, delete "call" and insert -- cell --, therefor.

Signed and Sealed this

Eighteenth Day of May, 2010

David J. Kappos
*Director of the United States Patent and Trademark Office*